United States Patent [19]

Raab et al.

[11] 3,991,163

[45] Nov. 9, 1976

[54] PROCESS FOR THE PRODUCTION OF III-V COMPOUNDS

[75] Inventors: Gunter Raab, Erlangen; Klaus Zeuch, Mark-Eckental, both of Germany

[73] Assignee: Siemens Aktiengesellschaft, Munich, Germany

[22] Filed: Mar. 28, 1974

[21] Appl. No.: 455,912

[30] Foreign Application Priority Data

Apr. 9, 1973   Germany............................ 2317797

[52] U.S. Cl.............................. 423/299; 75/134 T; 75/149
[51] Int. Cl.².................. C01B 25/00; C22C 28/00; C22C 12/00
[58] Field of Search.................... 423/299, 409, 412; 75/134 T, 149

[56]   References Cited
   UNITED STATES PATENTS

| | | | |
|---|---|---|---|
| 2,938,816 | 5/1960 | Gunther.............................. | 423/299 |
| 3,305,313 | 2/1967 | Sirgo et al........................... | 423/299 |
| 3,366,454 | 1/1968 | Folberth et al. .................... | 423/299 |
| 3,690,846 | 9/1972 | Akai et al. .......................... | 423/299 |

Primary Examiner—Oscar R. Vertiz
Assistant Examiner—Gregory A. Heller
Attorney, Agent, or Firm—Kenyon & Kenyon Reilly Carr & Chapin

[57]   ABSTRACT

A process for the production of compact polycrystalline III A – V B compounds such as GaP through direct synthesis from the components in a closed horizontal system, in which at least one of the components has a substantially higher partial vapor pressure over the molten compound being produced than do the other components. In carrying out the process, the components which are more difficult to vaporize are heated in a narrow reaction zone to a temperature in the range of 100° to 500° C below the congruent melting temperature of the compound being produced while the pressure of the easily vaporized components is adjusted so that it amounts to between 0.14 and 0.33 times the decomposition vapor pressure of the compound being produced and thus to 50 to 120 times the decomposition vapor pressure of the solution of the compound being produced in the components which are difficult to vaporize at the reaction temperature.

12 Claims, 2 Drawing Figures

PROCESS FOR THE PRODUCTION OF III-V COMPOUNDS

BACKGROUND OF THE INVENTION

This invention relates to the production of III A – V B compounds in general and more particularly to an improved process for producing polycrystalline compounds of this nature.

It has been well established that compounds known as III A – V B compounds are useful in semiconductor devices. What is referred to by the designation III A and V B are those elements of groups III A and V B of the periodic table of elements.

Monocrystalline gallium phosphide is becoming increasingly important as a basic material for the production of luminescent diodes that emit light in the visible region. One method of obtaining such monocrystalline gallium phosphide uses, as a starting material, polycrystalline gallium phosphide.

Various methods have been developed to produce this starting material. In a process described by C. J. Frosch and L. Derick in the Journal of the Electrochemical Society, Vol. 108, p. 251 (1961), polycrystalline gallium phosphide is produced from white phosphorus and gallium at temperatures of between 1450° and 1500° C and at a pressure of between 6 and 35 atmospheres. This process is extremely difficult to carry out and is not of particular interest for industrial use. In carrying out the process, the strength limit of the quartz ampule is exceeded because of the necessary high pressure and high temperature occuring at the same time, which, as a result, causes an extreme pressure to be exerted on the ampule. That is to say, the conversion is carried out in an ampule set in an autoclave and as a result, the wide pressure range of 6 to 35 atmospheres makes it difficult to adjust the necessary counterpressure on the ampule since the internal pressure cannot be measured. The high emission frequency requires a small penetration of the eddy currents into the workpiece such as a graphite boat. In other words, in order to obtain a high temperature it must be greatly overheated locally. As a result of this and the high temperature of 1500° C that exists in any case, a dark nontransparent coating is produced on the ampule wall, the coating consisting of gallium phosphide and carbon, thereby making optical measurement of temperature during the reaction impossible. In carrying out the reaction, the boat with the gallium is moved through the inductively-produced temperature region. Only with a subsequent second passage is it possible to obtain compact polycrystalline gallium phosphide which contains at the end of the synthesized bar free gallium.

Another method for the production of polycrystalline gallium phosphide is disclosed by S. J. Bass and P. E. Oliver in the Journal of Crystal Growth, Vol. 4, page 286 (1968). In their method, a reaction temperature of 1450° C is used with the operative pressure required between 8 and 10 atmospheres. In this method, it is possible to work without an autoclave and a graphite tube sealed at both ends is used as the reaction vessel. Phosphorus vapor is led into the tube through holes and reacts therein with gallium to form the gallium phosphide. When operating, for example, such that the quartz ampule moves at a speed of 1cm/hr through the heated zone, gallium phosphide having a carbon content of approximately 1000 ppm is obtained. This contamination is not the only disadvantage in this method. In addition, sticking of the gallium phosphide to the reaction-tube is a problem as is the slow speed of travel through the heated zone, which speed is necessary in order to obtain compact gallium phosphide.

In another method disclosed by S. E. Blum, R. J. Chicotka, B. K. Bischoff, in the Journal of the Electrochemical Society, Vol. 115, page 324 (1968), gallium and phosphorus are converted to gallium phosphide at a temperature of 1500° C and a phosphorus pressure of 5 to 24 atmospheres in an upright Bridgeman apparatus. In this method, the free gallium surface available is small and the time needed for complete conversion is correspondingly longer than in the case of a horizontal apparatus. The solidification speed of the completely molten gallium-phosphide is only approximately 1 cm per hour. Because of the long time required and the high temperature of 1500° C used, a reaction occurs with the reaction vessel resulting in contamination of the semiconductor material and a detrimental change in the reaction vessel.

In another method disclosed in British Pat. No. 1,251,251, in German Offenlegungsschrift No. 1,911,715 and in an article by J. P. Besselers in Material Research Bulletin, Vol. 3, p. 797 (1968) gallium phosphide is produced from the elements at temperatures of 1000° to 1200° C and at a pressure of 1 atmosphere. The conversion, however, is very time-consuming with only 7 grams of GaP produced in 5 days. In addition, the reaction product contains gallium inclusions. In another process described in German Pat. No. 1,029,803, gallium phosphide is produced from the elements with the work done by the two-temperature process. This process is carried out at the melting point of gallium phosphide and the corresponding equilibrium vapor pressure. The crystal being formed continuously draws phosphorus from the melt, which is only delivered subsequently to a limited extent, as the vapor pressure drops causing it to come out of the vapor phase. The maximum possible quantities of polycrystalline gallium phosphide obtained through this method, i.e., 7 to 8 grams per batch, is no longer sufficient for present-day requirements.

Thus, it can be seen that all these prior art methods suffer from different disadvantages and there is a need for producing required quantities of gallium phosphides and the like using a simple and efficient process.

SUMMARY OF THE INVENTION

The present invention provides such a process. It has unexpectively been discovered by the inventors herein that the production of III A – V B compounds, in particular gallium phosphide, from the elements can be accomplished at a temperature substantially below the melting point of the resultant compound. As a result, the compact stoichiometric polycrystalline compound obtained from this method does not have the difficiencies of the prior art and is suitable for the production of monocrystals.

The process of the present invention for the production of such compact polycrystalline compounds uses direct synthesis in a closed horizontal system in which at least one of the components has a higher partial pressure over the melt than does the other component or components. The components are heated to a temperature considerably below the melting point of the compound being produced with the reaction temperature reached only within a narrowly limited range. The pressure of the easily vaporized component or components is held far below the decomposition vapor pressure of the compound being produced and considerably above the decomposition vapor pressure of the melt at the reaction temperature. In carrying out the process of the present invention, a temperature gradient as steep as possible is desirable, i.e., between the narrowly limited range of high temperature and the remainder of the reaction vessel. The narrow high temperature range is then moved along the reaction vessel. According to one disclosed embodiment, this motion may be obtained by moving the reaction vessel longitudinally. With regard to the steep temperature gradient, a temperature gradient of approximately 100° C/cm has proved to be particularly advantageous. As disclosed, heating to the reaction temperature may be accomplished inductively or through radiation energy.

Suitable components for use in the present invention as components having a high partial vapor pressure are, for example, phosphorus and arsenic. The other reaction components which may be used with these are, for example, gallium, indium and aluminum. In producing gallium phosphide, a favorable temperature range for the narrow reaction zone has been found to be from 1000° to 1400° C and preferably 1200° to 1250° C, with a phosphorus vapor pressure of 5 to 12 atmospheres, preferably 9 to 10 atmospheres. The gallium phosphide obtained through this process is monophase, compact, polycrystalline and pure. Even when use is made of quartz boats, the gallium phosphide is only slightly contaminated with silicon. When graphite boats are used, the reaction products can be removed from the boat without difficulty and a formation of a coating on the quartz wall hindering optical temperature measurement is substantially reduced. If a boron-nitride boat is used, which boat may also be used repeatedly, the wall coating through the low temperature is reduced to such an extent that it is possible to use an actual-value indicator for regulating the high-frequency generator. In addition, the steep temperature profile hinders the formation of a cellular substructure of the type which leads to Ga inclusions. Through this, and through the thorough mixing of the reaction components in the high-temperature reaction zone, there is produced a compact monophase gallium phosphide which rapidly comes to equilibrium. An excess of gallium migrates as the reaction zone is shifted to the end of the bar. In order to obtain a compact material it is not necessary to make more than one zone pass in which the synthesized material is heated to the melting point. As a result, the run-through time is shortened as compared to the known processes. Furthermore, the stability of the quartz ampule is maintained since only as small as possible a high-temperature zone is used, resulting in the quartz only being subjected to brief local heating.

DETAILED DESCRIPTION OF THE PREFERRED EMBODIMENT

Figure 1:
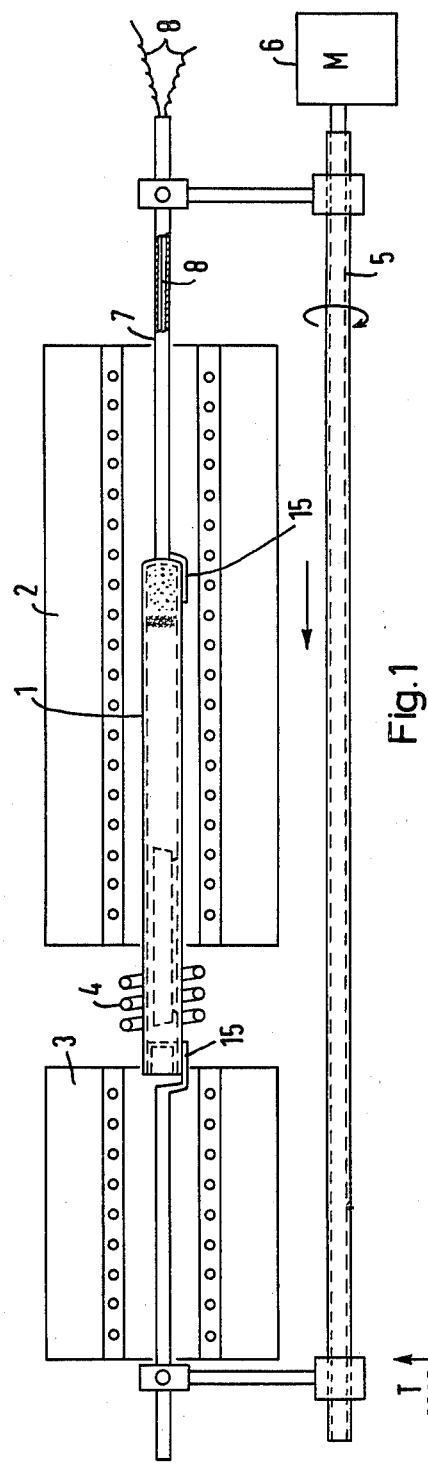
FIG. 1 is a schematic illustration of apparatus for carrying out the process of the present invention.

FIG. 1 illustrates an apparatus which may be used for carrying out the present invention. Illustrated, are two tubular furnaces designated 2 and 3. The furnace 2 is a phosphorus furnace and the furnace 3 a reheating furnace. The two furnaces are ridgedly mounted with a spacing of approximately 10 cm. Centered between the two furnaces is a water-cooled induction coil 4 made of silvered copper tubing having an inner diameter of 30 mm. The induction coils are energized by a 12-kw generator at a frequency of 450 khz (not shown).

The correct spacing of the two furnaces is quite important. The quartz ampule 1 is supported on two spoon-like holders 15. The holders 15 are coupled to a spindle 5 which is driven by a motor 6. Rotation of the motor 6 and spindle 5 in the direction indicated by the arrow, will result in motion of the holders 15 and the ampule therewith to the left as shown by the arrow. Motor 6 will be a variable speed motor so that the speed of movement can be controlled. As is more clearly seen through reference to FIG. 2, the ampule 2 is charged with red phosphorus 12 and gallium 14. The phosphorus is separated by quartz wool 13 from the main reaction space 17. The gallium 14 is placed in a half-round graphite boat 10 which is supported on ceramic feet 11. Boat 10 may also be made of boron nitride or of quartz.

The charged quartz tube 1 is heated under a vacuum and finish-heated with a quartz cap 9 and is fused at about $10^{-6}$ Torr over it's 40 cm length. With this manner of fusing, i.e., where only a narrow zone is fused, only a small portion of the gallium is heated to a high temperature such as a temperature of 1230° C. The remainder of the gallium 14 remains, until near the end of the reaction time as an elemental substance and becomes continuously tempered between 510° and 515° C. As a small zone of the gallium 14 is heated to the reaction temperature, a portion of the phosphorus reacts to form the gallium phosphide indicated as 18 on FIG. 2. In order to obtain a continuously constant temperature, a thermoelement 8, resting against the ampule wall, and carried along with the holding tube 7 during the pulling process is used as an input to a proportional integral regulator to adjust the phosphorus furnace 2 in such a manner that the right end of the ampule with the phosphorus charge is kept at a constant temperature of between 510° and 515° C. If this portion of the quartz ampule 1 is the coolest portion of the reaction space 17, a phosphorus pressure of between 9 and 10 atmospheres will result. The desired temperature pattern illustrated by FIG. 2 can be achieved by regulating the after-heating furnace 3 to 750° C, and heating the gallium melt in the narrow reaction zone within the induction coil 4 to approximately 1300° C. Furthermore, the heating coil in the phosphorus furnace is wound asymmetrically to obtain the type of profile illustrated.

Using pulling speeds of between 1.8 and 4.3 cm per hour, which corresponds to a run-through time of 5 to 7 hours, it is possible to obtain compact amber-color ingots. The yield of polycrystalline gallium phosphide averages 80%, relative to the amount of gallium and red phosphorus used.

Gallium phosphide made according to the present invention can advantageously be used for producing monocrystals by the protected-melting process under high pressure. Undoped monocrystals produced in this manner have, at room temperature, a charge-carrier concentration of 2 to $4 \times 10^{16} cm^{-3}$, and a mobility of 140 to 190 $cm^2 v^{-1} sec^{-1}$. Gallium phosphide manufactured according to the present invention, may also be used as a source for the gas-phase epitaxy of gallium phosphide.

Figure 2:
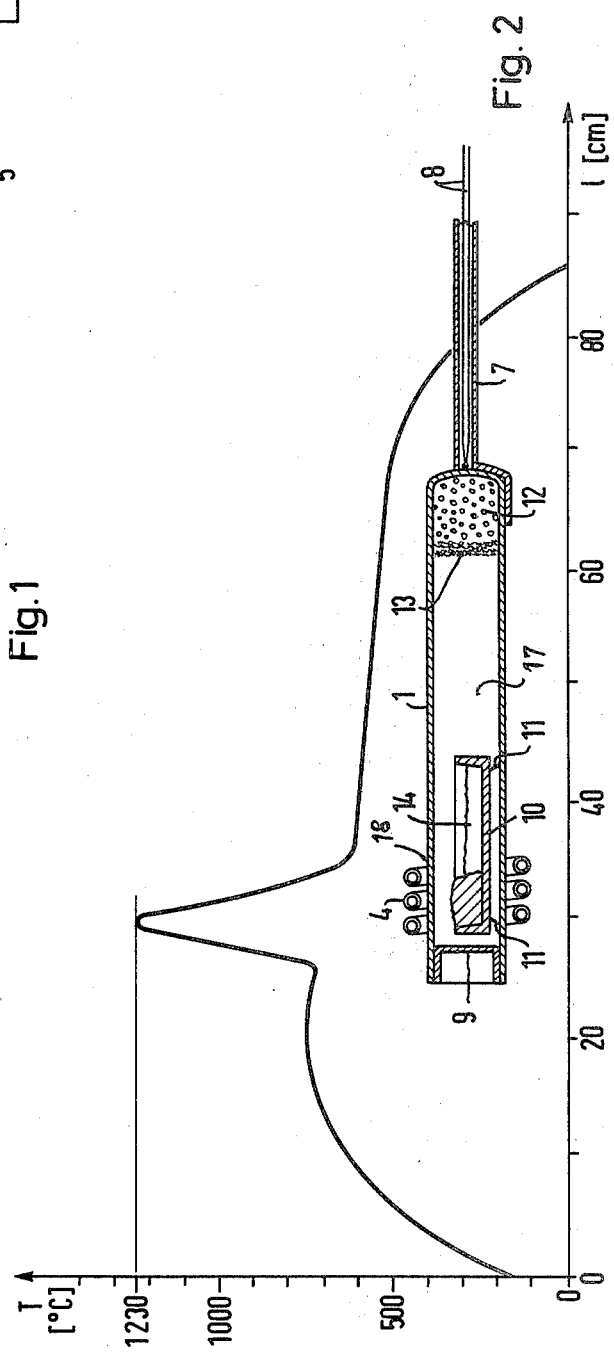
FIG. 2 is a graphical illustration of the temperature profile in the apparatus of FIG. 1 and furthermore illustrates a portion of that apparatus in a cross-sectional view in further detail.

The invention will now be explained in more detail with the aid of the following examples. In each case, an arrangement according to that shown on FIG. 1 is used in carrying out the process. A quartz ampule 1 of 19mm ID × 25mm OD is supported in the arrangement according to FIG. 1 in the manner described above. The desired temperature profile illustrated on FIG. 2 is obtained with the high temperature region established through the use of inductive heating with coils for energized with a 450-khz high frequency generator, the furnace 2 regulated to approximately 510° C and the furnace 3 to 750° C, with the two furnaces spaced apart 10 cm. The temperature of the furnace 3 is primarily to prevent condensation of the phosphorus and is not as critical as that of the furnace 2. For the purpose of measuring the temperature in furnace 2, a mantel thermoelement is installed in ampule holder and guide 7. Mantel thermoelements are more sensitive to temperature than other thermoelements and for that reason, one is used herein. The synthesis ampule 1 is fused in a high vacuum of about $10^{-6}$ Torr while using a quartz cap 9. The direct transmission of heat from the hot reaction-boat 10 to the ampule wall is prevented to a large degree by the ceramic feet 11 on which the boat 10 stands.

EXAMPLE 1

As starting materials, 15.5 grams (0.5 mole) of red phosphorus 12 which is extremely pure, was placed in a carefully cleaned 60 cm long quartz tube having a 19 mm inner diameter which had a wall thickness of 3 mm and was closed at one end with an NS 29 ground-in stopper. At the other end, loosely packed quartz wool 13 was placed retraining the phosphorus 12. The quartz wool was further used to prevent a flow of heat from the high temperature zone to the phosphorus. 35 grams (0.5 mole) of highly pure gallium 14 was placed in the graphite boat 10. The fused ampule was highly heated in the following sequence: furnace 3 was heated to 750° C, the high-temperature zone within the coils 4 to approximately 1000° C at first, furnace 2 to 510° C, and finally the high-temperature zone was raised to approximately 1230° C. After the beginning of the reaction, the ampule was moved through the high temperature reaction zone at a speed of approximately 40 mm per hour.

After conversion, the residual gallium, which, because of the ampule volume which was not considered in the weighing of the phosphorus, and because of the uncompensated decomposition vapor pressure, remained behind and, as a result of the pulling process, moved to the bar end. This residual gallium was then removed by treatment with hydrochloric acid. The final result was 43 grams of GaP which can be used directly for monocrystal production.

EXAMPLE 2

In this example, 10.8 grams (0.35 mole) of phosphorus were placed in the ampule along with 24.5 grams (0.35 mole) of gallium placed in a boron nitride boat 60 mm long and having a wall thickness of 0.8 mm. With a pulling speed of 18 to 40 mm per hour, a polycrystalline gallium phosphide rod weighing 33 grams was obtained after treatment with hydrochloric acid to remove the residual gallium.

Attempts to produce gallium phosphide using frequencies of 1.5 khz and 4 khz in energizing the coil 4 failed because the gallium was insufficiently heated.

EXAMPLE 3

Using the same amounts of starting material as in Example 2, and with the gallium in a quartz boat having a smooth (i.e., untreated surface) or a sand-blasted or carbonized surface with the boat 100 mm long and having a wall thickness of 1.5 mm, after carrying out the reaction as described above and treatment with hydrochloric acid to remove the excess gallium, 32 grams of dark-colored but dense polycrystalline GaP were obtained. The dark coloring of the material results from its silicon content which amounted to 80 ppm. When the reaction material cooled down, the reaction boat split, so that it can only be used once. The phosphorus-gallium interval is 200 mm. For the purpose of reducing the transmission of heat to the ampule wall, the reaction boat was supported on a ceramic plate.

EXAMPLE 4

In this example, 68 grams (2.2 mole) of highly-pure red phosphorus was weighed into a quartz ampule having dimensions of 35 × 46mm (ID × OD) and 154 grams (2.2 mole) of highly-pure gallium weighed into a 155 mm long graphite boat. The graphite boat stood on ceramic feet in the ampule. After the required temperature profile was reached, the reaction ampule was pushed at a speed of 40 mm per hour through the high temperature zone. The conversion process took 4 hours. After hydrochloric acid treatment, a monophase bar of polycrystalline GaP weighing 205 grams and which was transparent was obtained. The reaction boat was capable of being reused after cleaning and reheating in a vacuum.

EXAMPLE 5

In this example, 12.4 grams (0.4 mole) of highly-pure red phosphorus of the same type as used in Examples 1 to 4 was weighed in and fixed into the ampule using the wool 13. Into a 150 mm long graphite boat, 46 grams (0.4 mole) of indium were placed. Using the same apparatus as described in connection with examples 1 to 4, the reaction temperature in the reaction zone was brought to 980° C. After the temperature and furnace 2 reached 510° C, the reaction ampule was pushed through the furnace system at a speed of 25 mm per hour. After removal of excess indium at the end, a monophase polycrystalline InP rod weighing 55 grams was obtained.

In each of the Examples, the phosphorus is an easily vaporized material and has a substantially higher partial vapor pressure with respect to the stoichiometric melt of the compound being produced than the other component. Other group V elements which are relatively volatile include As and Sb. The group III metals Al, Ga and In have much lower vapor pressures. Specifically, the pressure of the easily vaporized component will be between 0.14 and 0.35 and preferably between 0.25 and 0.28 that of the decomposition vapor pressure of the compound being produced. As a result, it will be 50 to 120 times and preferably 100 times the decomposition vapor pressure of the solution of the compound being produced in the component which is difficult to vaporize at the reaction temperature.

Thus, an improved method of producing compact polycrystalline III A - V B compounds such as GaP, has been described. Although a specific method has been illustrated and described, it will be obvious to those skilled in the art that various modifications may be made without departing from the spirit of the invention which is intended to be limited solely by the appended claims.

What is claimed is:

1. In a process for the production of compact polycrystalline III - V compounds wherein the group V element is selected from the group consisting of phosphorus, arsenic and the group III element is selected from the group consisting of aluminum, gallium, and indium through direct synthesis of components in a closed horizontal system, with one of the components being easy to vaporize, having a substantially higher partial vapor pressure over the stoichiometric melt of the compound being produced than the other component, which is difficult to vaporize, in which the components are placed in a reaction ampule with the element which is easy to vaporize in one end of the ampule and the element which is difficult to vaporize contained within a boat near the other end of the ampule, with the element which is difficult to vaporize heated to a high temperature and the easily to vaporize element heated to a lower temperature resulting in a high pressure and temperatures at said ampule, the improvement comprising:

a. heating the element which is difficult to vaporize in a 1 to 2 cm wide reaction zone to a temperature of between 100° and 500° C below the congruent melting temperature of the compound being produced;

b. heating the end of said ampule containing the easily vaporized element to the temperature corresponding to a decomposition vapor pressure which is 0.1 to 0.35 that of the decomposition pressure of the compound being produced and thus 50 to 100 times the decomposition vapor pressure of the solution of the compound being produced in the difficult to vaporize component at the reaction zone temperature;

c. reacting the element which is difficult to vaporize with said easily vaporized element at said reaction zone to produce said compound; and d. recovering the compound so produced.

2. A process according to claim 1 and further including the step of moving said horizontal closed system with respect to said reaction zone so as to move the produced compound out of said reaction zone while moving a fresh supply of difficult to vaporize element into said reaction zone.

3. A process according to claim 1 wherein the heating of said narrow reaction zone is narrowly confined to that zone so as to provide a temperature gradient on each side of said reaction zone which is as steep as possible.

4. A process according to claim 3 and further including the step of effecting relative motion between said reaction zone and the horizontal closed system.

5. A process according to claim 3 wherein said temperature gradients are approximately 100° C/cm.

6. A process according to claim 1 wherein said reaction zone is heated inductively.

7. A process according to claim 1 wherein said reaction zone is heated by radiation energy.

8. A process according to claim 1 wherein said reaction zone temperature is 210° to 265° C below said congruent melting temperature, said pressure of the easily vaporized component is regulated to between 0.25 and 0.28 of said decomposition vapor pressure and thus to approximately 100 times the decomposition vapor pressure of said solution.

9. A process according to claim 8 wherein said one component of higher partial vapor pressure is phosphorus and the other component is gallium.

10. A process according to claim 9 wherein the temperature of said reaction zone is between 1000° and 1400° C and the phosphorus vapor pressure between 5 and 12 atmospheres.

11. A process according to claim 10 wherein said temperature is between 1200° and 1250° C and said phosphorus vapor pressure between 9 and 10 atmospheres.

12. A process according to claim 11 wherein the temperature gradient at each side of said reaction zone is approximately 100° C/cm and further including the step of effecting relative motion between said reaction zone and the horizontal closed system.

* * * * *